United States Patent
Jilek et al.

(10) Patent No.: US 10,851,451 B2
(45) Date of Patent: Dec. 1, 2020

(54) METHOD OF DEPOSITION OF A WEAR RESISTANT DLC LAYER

(71) Applicant: PLATIT A.S., Sumperk (CZ)

(72) Inventors: Mojmir Jilek, Sumperk (CZ); Mojmir Jilek, Sumperk (CZ)

(73) Assignee: PLATIT A.S., Sumperk (CZ)

( * ) Notice: Subject to any disclaimer, the term of this patent is extended or adjusted under 35 U.S.C. 154(b) by 151 days.

(21) Appl. No.: 16/075,533

(22) PCT Filed: Jan. 26, 2017

(86) PCT No.: PCT/CZ2017/000002
§ 371 (c)(1),
(2) Date: Aug. 3, 2018

(87) PCT Pub. No.: WO2017/133715
PCT Pub. Date: Aug. 10, 2017

(65) Prior Publication Data
US 2019/0040518 A1    Feb. 7, 2019

(30) Foreign Application Priority Data

Feb. 5, 2016  (CS) ...................................... 2016-60

(51) Int. Cl.
| | |
|---|---|
| *C23C 14/06* | (2006.01) |
| *C23C 14/02* | (2006.01) |
| *C23C 14/32* | (2006.01) |
| *H01J 37/32* | (2006.01) |
| *C23C 16/26* | (2006.01) |

(52) U.S. Cl.
CPC ........ *C23C 14/0611* (2013.01); *C23C 14/022* (2013.01); *C23C 14/0605* (2013.01); *C23C 14/325* (2013.01); *C23C 16/26* (2013.01); *H01J 37/32055* (2013.01); *H01J 37/3266* (2013.01)

(58) Field of Classification Search
CPC ............ C23C 14/0605; C23C 14/0611; C23C 14/34; C23C 14/3485; C23C 14/3492; C23C 14/35; C23C 14/542; C23C 16/26; C23C 14/325; C23C 14/022; H01J 37/32055; H01J 37/32422; H01J 37/34; H01J 37/3402; H01J 37/3405; H01J 37/3414; H01J 37/37; H01J 37/3417; H01J 37/3423; H01J 37/3426; H01J 37/345; H01J 37/3458; H01J 37/3461; H01J 37/3467; H01J 37/3266
See application file for complete search history.

(56) References Cited

U.S. PATENT DOCUMENTS

| | | | |
|---|---|---|---|
| 4,673,477 A | * | 6/1987 | Ramalingam ......... C23C 14/325 118/50.1 |
| 5,401,543 A | | 3/1995 | O'Neill et al. |
| 5,861,088 A | | 1/1999 | Curtins |
| 6,261,424 B1 | | 7/2001 | Goncharenko et al. |
| 6,338,778 B1 | | 1/2002 | Giersch et al. |
| 6,548,817 B1 | * | 4/2003 | Anders ............. H01J 37/32055 250/426 |
| 9,761,424 B1 | * | 9/2017 | Gorokhovsky ..... H01J 37/3458 |
| 2004/0069233 A1 | | 4/2004 | Holubar et al. |
| 2007/0034501 A1 | | 2/2007 | Bender |
| 2009/0065350 A1 | | 3/2009 | Anders |

FOREIGN PATENT DOCUMENTS

| | | |
|---|---|---|
| CZ | 287483 B6 | 12/2000 |
| CZ | 296094 B6 | 1/2006 |
| EP | 2602354 A1 | 6/2013 |
| KR | 20140108617 A | 9/2014 |
| WO | WO-2005/089272 A2 | 9/2005 |

OTHER PUBLICATIONS

Grimm, W.; Weihnacht, V. Gas Phase Modification of Superhard Carbon Coatings Deposited by Pulsed DC-Arc-Process. Plasma Processes and Polymers 2009, 6 (S1). (Year: 2009).*
Swift, P. D. Macroparticles in Films Deposited by Steered Cathodic Arc. Journal of Physics D: Applied Physics 1996, 29 (7), 2025-2031. (Year: 1996).*
Mitura, S.; Haś, Z.; Gorokhovsky, V. The System for Depositing Hard Diamond-like Films onto Complex-Shaped Machine Elements in an R.F. Arc Plasma; Surface and Coatings Technology 1991, 47 (1-3), 106-112. (Year: 1991).*
K. Oskomov, N. Sochugov, Hui-Gon Chun and S. Rabotkin, "Pulsed magnetron sputtering system with rotating graphite cathode for diamond-like carbon films deposition," 7th Korea-Russia Int'l Symp. on Sci. and Tech., Proceedings KORUS 2003. (IEEE Cat. No .03EX737), Ulsan, South Korea, 2003, pp. 76-78. (Year: 2003).*
Grill, "Diamond-Like Carbon: State of the Art," Diamond and Related Materials, 8(2-5):428-434 (1999).
International Preliminary Report on Patentability for Application No. PCT/CZ2017/00002, dated May 7, 2018.

(Continued)

*Primary Examiner* — William P Fletcher, III
(74) *Attorney, Agent, or Firm* — Marshall, Gerstein & Borun LLP

(57) ABSTRACT

A method of deposition of a wear resistant DLC layer onto substrates in a vacuum chamber from a graphite cathode by means of a low-voltage pulsed arc. Current pulses alternate with a holding current and a cathode spot moves on a surface of a graphite cathode. The motion of the cathode spot on the surface of the graphite cathode being steered by a magnetic field generated by a magnetic field source arranged under the surface of the graphite cathode. The value of the current pulses is 250 to 1000 A, the value of the holding current is 40 to 200 A, the frequency of the pulses is 100 to 5000 Hz and the pulse duty cycle is 1 to 90%, the intensity of the magnetic field in the place of the cathode spot being 5 to 40 mT.

2 Claims, 3 Drawing Sheets

(56) References Cited

OTHER PUBLICATIONS

International Search Report and Written Opinion for Application No. PCT/CZ2017/000002, dated May 2, 2017.
Meunier, "Erosion of carbon arc cathodes operating in the thermofield electron emission mode," Department of the Chemical Engineering (1997).
Swift, "Macroparticles in films deposited by steered cathodic arc," J. Phys. D: Applied Physics, 29(7):2025-31 (1996).
Takikawa et al., "Review of Cathodic Arc Deposition for Preparing Droplet-Free Thin Films," IEEE Transactions on Plasma Science, 35(4):992-999 (2007).
Werner et al., "Gas phase modification of superhard carbon coatings deposited by pulsed DC-Arc-Process," Plasma Processes and Polymers, 6(S1):S433-7 (2009).
Search Report and Opinion for Czech Patent Application No. PV 2016-60, dated Aug. 17, 2016. (English Translation).
Miyano et al., "Retrograde motion velocity of graphite cathode spot in vacuum arc deposition apparatus" Transaction of the Institute of Electrical Engineers of Japan, Part A, vol. 114-A, No. 2, ISSN: 0385-4205, pp. 117-122, May 29, 2015.

* cited by examiner

METHOD OF DEPOSITION OF A WEAR RESISTANT DLC LAYER

TECHNICAL FIELD

The invention relates to a method of deposition of a wear resistant DLC layer onto substrates in a vacuum chamber from a graphite cathode by means of a low-voltage pulsed arc wherein current pulses alternate with a holding current and a cathode spot moves on a surface of a graphite cathode, the motion of the cathode spot on the surface of the graphite cathode being steered by a magnetic field generated by a magnetic field source arranged under the surface of the graphite cathode.

PRIOR ART

Various methods are used to apply wear resistant DLC (diamond like carbon) layers. Besides the CVD (chemical vapor deposition) methods these are mainly the physical vapor deposition methods abbreviated as PVD, which comprise of low voltage vacuum arc deposition magnetron sputtering (non-reactive or reactive) and plasma spraying.

The low-voltage arc PVD technology can be used to prepare hard wear resistant layers of the DLC (diamond line carbon) type with a high content of sp3 bonds known as ta-C (tetrahedral amorphous carbon). The hardness and wear resistance of these layers is close to the crystalline diamond and it outperforms all the other types of DLC coatings prepared by means of other technologies by the factor of 2 to 4. (A. Grill, Diamond and Related Materials; Vol. 8 (1999); pp. 428-434).

The layers are applied in a vacuum chamber. Before the entire deposition of the layers, the pressure in the chamber is reduced, the chamber is heated up to the required temperature depending on the material, an adhesion layer is applied and the wear resistant layer is applied after that.

During the preparation of ta-C layers with the use of the low-pressure low-voltage arc, material evaporates from the surface of the graphite cathode. The arc burns in the place of the cathode spot, which has a diameter of a few μm and a temperature of the order of 10,000° C. The cathode material evaporates in the location of the cathode spot due to the high temperature, which is accompanied by a thermal shock that tears the material near the cathode spot apart. Thus, large pieces of the target material, i.e. macroparticles, are torn off, which are subsequently deposited on the substrate to be coated.

The amount and size of these macroparticles can be partly eliminated by acceleration of the cathode spot (Study on cathode spot motion and macroparticles reduction in axisymmetric magnetic field-enhanced vacuum arc deposition; ARTICLE in VACUUM, April 2010), wherein the motion of the cathode spot can be steered by a magnetic field along a closed loop on the cathode surface (Macroparticles in films deposited by steered cathodic arc; P D Swifty; School of Physics, University of Sydney, NSW 2006, Australia).

In the case of a graphite target, the motion speed of the cathode spot is extremely low (PARTICLES EMISSION CONTROL AT-GRAPHITE CATHODE IN ARC ION PLATING DEPOSITION; MUNTHER ISSA KANDAH; Department of the Chemical Engineering; McGill University; Montreal; Under the supervision of Dr. J.-L. Meunier; March 1997), which has an adverse impact on the quantity and size of macroparticles and consequently an increased coating roughness.

The problem of ta-C layers prepared with the use of the low-voltage arc consists of an extremely high roughness of the prepared coatings because the cathode spot moves very slowly (at a speed on the order of 1 cm/s) and it penetrates to a considerable depth of the cathode surface (approx. 1 mm) and large pieces of graphite are torn off due to a thermal shock near the cathode spot.

Many preparation methods of ta-C layers using the low-voltage arc method are known that eliminate the high quantity of macroparticles.

The generally most commonly used method is the macroparticle separation method (e.g. US20090065350) where between the graphite cathode and the substrates to be coated a plasma duct is provided in which heavy macroparticles (which move along a straight line) and positively charged C+ ions, whose path can be steered by a magnetic field, are separated. The greatest disadvantage of this method is a considerable reduction of the growth rate of the layer.

Other methods are based on using a pulsed arc (see e.g. U.S. Pat. No. 6,261,424B1). Current pulses of the arc usually vary between the values of 300-500 A. A pulsed arc can be operated in two ways.

In the first method of using a pulsed arc, the arc is completely turned off and it is ignited e.g. by means of a laser (see e.g. U.S. Pat. No. 6,338,778B1), or by means of a source for magnetron sputtering (see e.g. WO2005/089272). A disadvantage of this method is that an expensive arc ignition technology (laser, magnetron) is required.

In the other method of using a pulsed arc, the basic holding current (Gas Phase Modification of Superhard Carbon Coatings Deposited by Pulsed DC-Arc-Process; Werner Grimm, Volker Weihnacht; Plasma Processes and Polymers) is combined with high current pulses. A disadvantage of this method is that the space where the arc burns is not precisely defined. For this reason, larger, e.g. long cylindrical targets cannot be used.

DISCLOSURE OF THE INVENTION

Drawbacks of the state of the art are remedied by a method of deposition of a wear resistant DLC layer onto substrates in a vacuum chamber from a graphite cathode by means of a low-voltage pulsed arc wherein current pulses alternate with a holding current and a cathode spot moves on a surface of the graphite cathode, the motion of the cathode spot on the surface of the graphite cathode being steered by a magnetic field generated by a magnetic field source arranged under the surface of the graphite cathode in accordance with the invention the principle of which is that the value of the current pulses is 250 to 1000 A, the value of the holding current is 40 to 200 A, the frequency of the pulses is 100 to 5000 Hz and the pulse duty cycle is 1 to 90%, the intensity of the magnetic field in the place of the cathode spot being 5 to 40 mT.

A surprising and quite unexpected effect of the method based on the invention is that the cathode spot is accelerated by several orders, the steering of the cathode spot motion by a magnetic field being maintained.

In a preferred embodiment, the motion of the cathode spot on the surface of the graphite cathode is steered by the magnetic field along a path having the shape of a closed loop.

It is advantageous if a rotary cylindrical cathode is used as the cathode.

The method in accordance with this invention provides the following advantages.

Since the cathode spot moves faster, the generation of macroparticles is reduced. This results in a reduced roughness of the coating.

Higher ionization of particles evaporated in the place of the cathode spot leads to a higher hardness of the prepared layers.

Maintaining the cathode spot within the expected path is simpler as the speed of the cathode spot is considerably higher than the rotation speed of the cathode, which prevents the cathode spot from being forced out of its optimum path due to the rotation of the cathode. This leads to a higher stability of arc burning.

Another result of the method in accordance with the invention is a better uniformity of the prepared layers.

BRIEF DESCRIPTION OF DRAWINGS

The method of deposition of a wear resistant DLC layer onto substrates in a vacuum chamber from a graphite cathode by means of a low-voltage pulsed arc will be described in a more detailed way by means of particular embodiment examples with references to drawings where in FIG. 1 the path of the cathode spot on a rotary cylindrical cathode is indicated with a dashed line.

DESCRIPTION OF PREFERRED EMBODIMENTS

Figure 1:
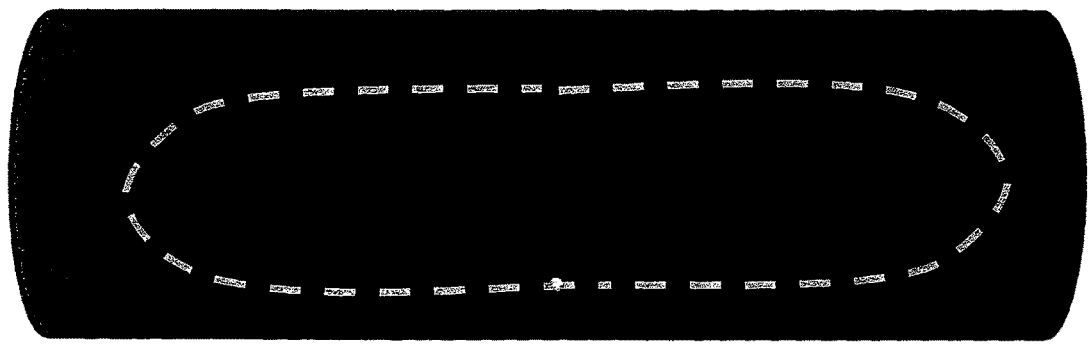

The method of deposition of a wear resistant DLC layer onto substrates is executed in a vacuum chamber from a graphite cathode by means of a low-voltage pulsed arc. During the deposition, cathode pulses alternate with the holding current and the motion of the cathode spot on the surface of the graphite cathode is steered by a magnetic field generated by a magnetic field source arranged under the surface of the graphite cathode. The cathode spot moves on the surface of the graphite cathode along the path having a closed loop shape (see FIG. 1).

The value of the current pulses is 250 to 1000 A, the value of the holding current is 40 to 200 A, the frequency of the pulses is 100 to 5000 Hz and the pulse duty cycle is 1 to 90%, the intensity of the magnetic field in the place of the cathode spot being 5 to 40 mT.

The pulse duty cycle is the ratio of the active part of arc burning, i.e. the time when the arc burns at a high current and the time of one pulse. 100% duty cycle corresponds to high current burning only. 30% duty cycle means that for 30% of the pulse time the arc burns at a high current and for 70% of the pulse time the arc burns at a low current.

The cathode spot acceleration mechanism and the related reduction of the number of generated undesired macroparticles can be explained as follows:

At the moment of a current pulse (at least 200 A), the cathode spot is divided into more cathode spots. As long as the cathode spots are near each other, they mutually produce a strong magnetic field that is stronger by an order than an external magnetic field, which accelerates the cathode spots, can be. The cathode spots achieve a speed of the order of 10 m/s and at this moment the occurrence of undesired macroparticles is minimal. A pulse must not be too long because as the cathode spots move apart from each other, the mutual magnetic fields gets abruptly reduced. The maximum suitable length of a pulse is of the order of 1 ms. After deactivation of the current impulse the arc burns in the holding current mode when just one cathode spot burns on the cathode. The duration of this deactivation must be sufficiently long to make sure that only one cathode spot will remain burning. If the motion of the cathode spot is steered by an external magnetic field, the duration of this deactivation must be sufficiently long for the cathode spot to return to the area where its motion is steered by an external magnetic field. During the time when only one cathode spot is burning in the holding pulse mode, it is not significantly accelerated and the cathode spot virtually burns in one place. From this point of view it is desirable that the cathode spot should only burn in the holding pulse mode for the shortest possible time. If the external magnetic field is too weak, in the current pulse mode the cathode spots may move against the motion direction of the cathode spot, which is defined by the external magnetic field, which is undesirable. If the external magnetic field is too strong, the process is unstable. Thus, an optimum result is only achieved by a suitable combination of all the parameters so that the speed of the cathode stain can be as high as possible and at the same time the process can be stable. This leads to a minimal occurrence of undesired macroparticles and consequently to minimal roughness of the produced layer.

Example 1

A polished sample made of tool steel having the dimensions of 15×15×5 mm was placed in a holder rotating around 3 axes on a substrate holder in a vacuum coating chamber. A central cylindrical rotary graphite cathode made of isostatically compressed graphite (glass graphite can also be preferably used) was positioned in the center of the vacuum chamber in the middle of the rotating substrates to be coated and was connected to a pulse source of low-voltage arc. The magnetic field intensity in the place of motion of the cathode spot was 17 mT. In the door of the vacuum chamber, a titanium cylindrical rotary cathode was placed that was connected to a low-voltage arc source. The chamber was evacuated to the pressure of $5 \times 10^{-3}$ Pa.

Before the entire deposition of the DLC layer, the substrate was subjected to metal ion etching with Ti ions from the cathode for 10 min and after the end of the metal ion etching a Ti layer was applied for 5 min.

During the deposition of the DLC layer, the surface of the substrate was bombarded by carbon ions generated by the pulsed arc of the graphite cathode at the following parameters:

| | |
|---|---|
| Holding current | 100 A |
| Bias at the samples | 500 V |
| Pulse current | 400 A |
| Pulsed arc frequency | 1000 Hz |
| Duty cycle | 40% |
| Step length | 5 min |

After the end of the step of bombarding with carbon ions a ta-C layer was applied at the following coating parameters:

| | |
|---|---|
| Holding current | 100 A |
| Bias at the samples | floating potential (5-10 V) |
| Pulse current | 500 A |
| Pulsed arc frequency | 1000 Hz |
| Duty cycle | 40% |
| Step length | 20 min |

Figure 2:
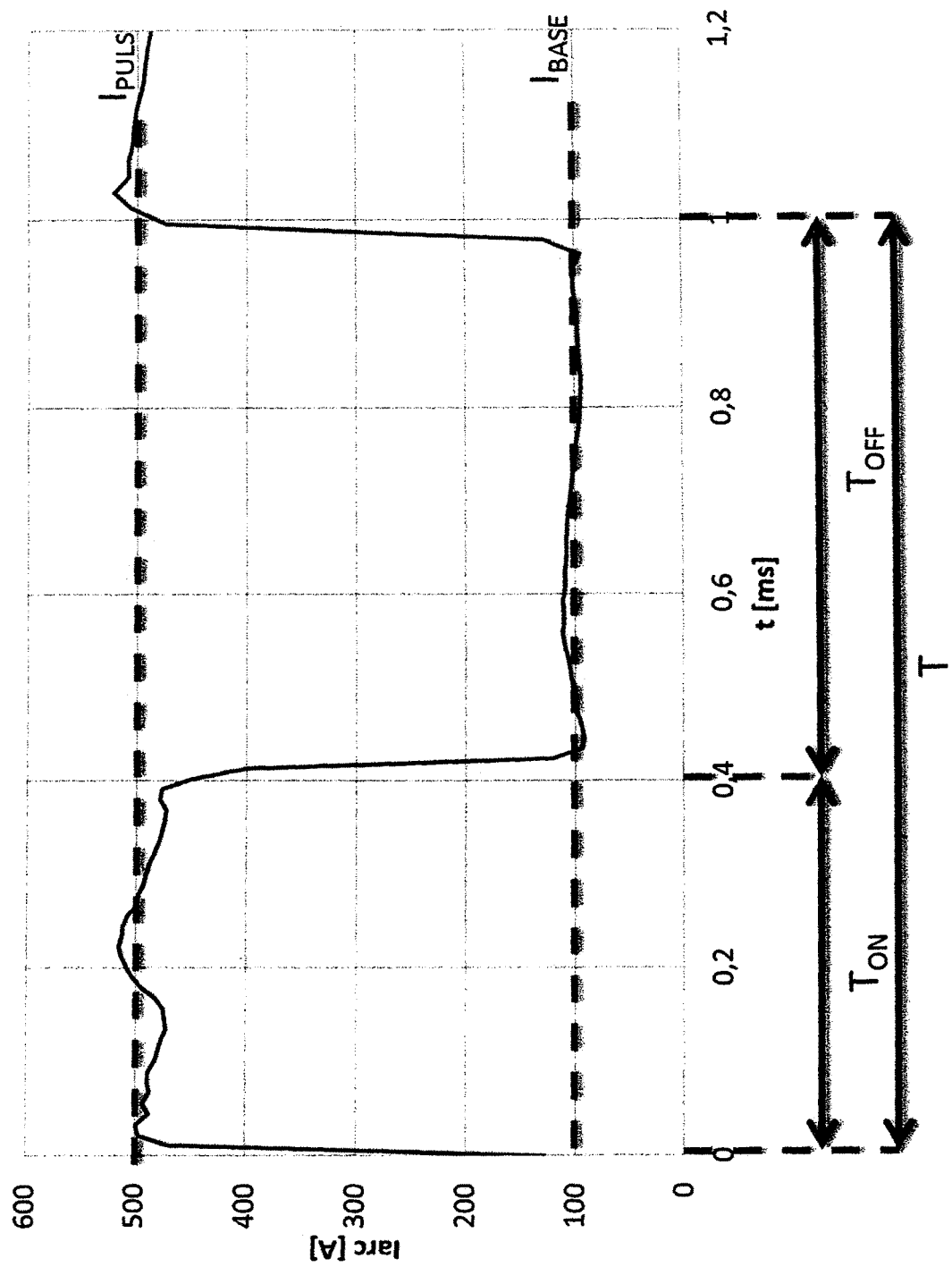
FIG. 2 shows the time course of one pulse during deposition of the ta-C layer in accordance with Example 1.
Figure 3:
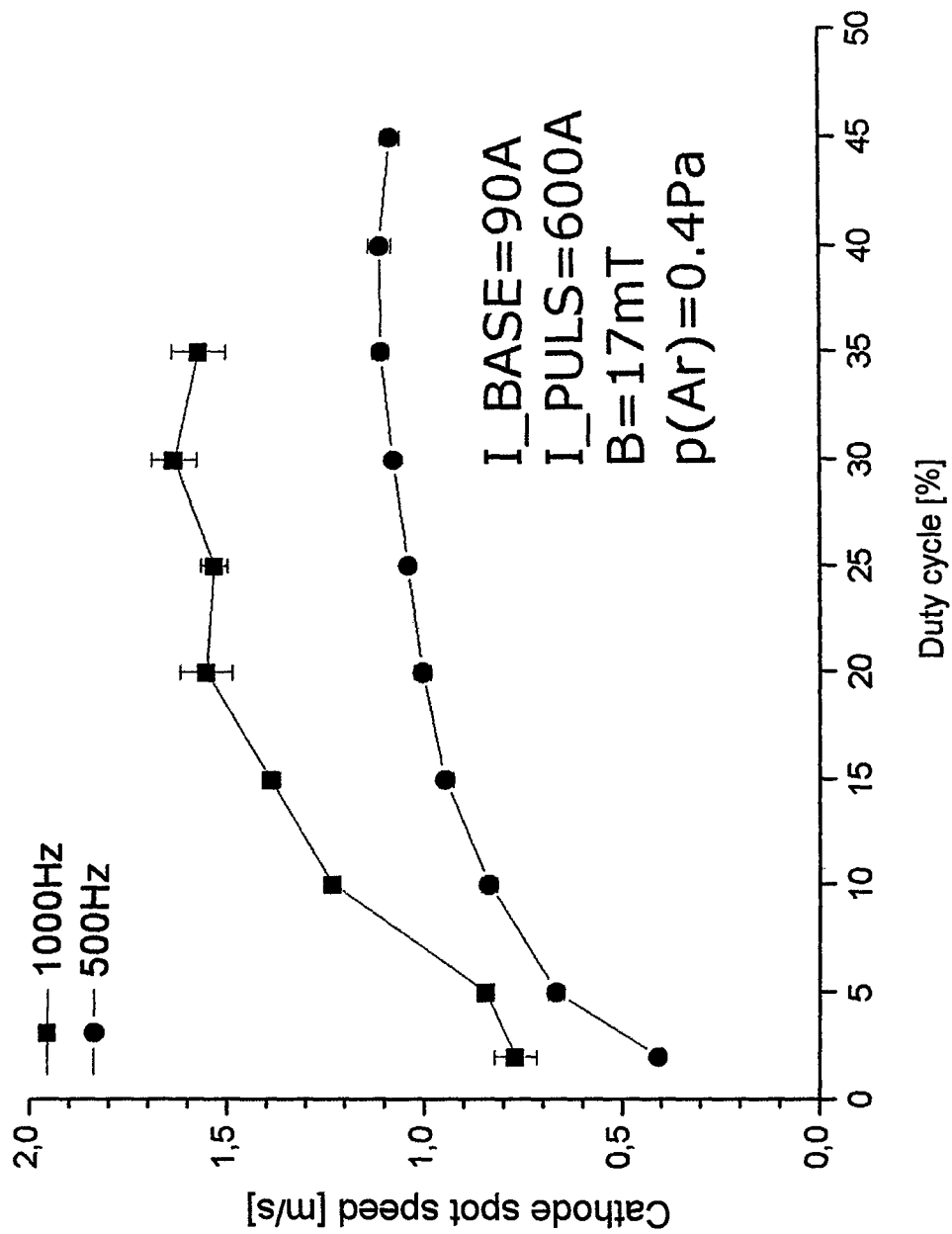
FIG. 3 presents a graph of dependence of the cathode spot on the duty cycle and frequency of pulses.

The micro-hardness of the ta-C layer applied in the last step was 40 GPa, thickness 1 µm, cathode spot speed 1.5 m/s The time course of one pulse during the deposition of the ta-C layer is shown in FIG. 2, individual values representing:

$T_{ON}$ time for which the high current $I_{PULS}$ flows into the arc $T_{OFF}$ time for which the low holding current $I_{BASE}$ flows into the arc T total pulse time $I_{arc}$ current to the arc (A)

t time (ms)

Derived Quantities:

f frequency of pulses; f=1/T

D duty cycle;

$$D = \frac{T_{ON}}{T}$$

The following values are related to the pulse course shown in FIG. 2:

$T_{ON}$=0.4 ms, $I_{PULS}$=500 A
$T_{OFF}$=0.6 ms, $I_{BASE}$=100 A
T=1 ms
f=20,000 Hz=20 kHz
D=40%

Example 2

A polished sample made of tool steel having the dimensions of 15×15×5 mm was placed in a holder rotating around 3 axes on a substrate holder in a vacuum coating chamber. A central cylindrical rotary graphite cathode made of isostatically compressed graphite (glass graphite can also be preferably used) was positioned in the center of the vacuum chamber in the middle of the rotating substrates to be coated and was connected to a pulse source of low-voltage arc. The magnetic field intensity in the place of motion of the cathode spot was 17 mT. In the door of the vacuum chamber, a titanium cylindrical rotary cathode was placed that was connected to a low-voltage arc source. The chamber was evacuated to the pressure of 5×10⁻³ Pa.

Before the entire deposition of the DLC layer, the substrate was subjected to metal ion etching with Ti ions from the cathode for 10 min and after the end of the metal ion etching a Ti layer was applied for 5 min.

During the deposition of the DLC layer, the surface of the substrate was bombarded by carbon ions generated by the pulsed arc of the graphite cathode at the following parameters:

| | |
|---|---|
| Holding current | 90 A |
| Bias at the samples | 400 V |
| Pulse current | 400 A |
| Pulsed arc frequency | 1000 Hz |
| Duty cycle | 2% |
| Step length | 10 min |

After the end of the step of bombarding with carbon ions a ta-C layer was applied at the following coating parameters:

| | |
|---|---|
| Holding current | 90 A |
| Bias at the samples | floating potential (5-10 V) |
| Pulse current | 400 A |
| Pulsed arc frequency | 1000 Hz |
| Duty cycle | 2% |
| Step length | 60 min |

The micro-hardness of the ta-C layer applied in the last step was 40 GPa, thickness 1 µm, cathode spot speed 0.5 m/s Example 3

A polished sample made of sintered carbide having the dimensions of 15×15×5 mm was placed in a holder rotating around 3 axes on a substrate holder in a vacuum coating chamber. A central cylindrical rotary graphite cathode made of isostatically compressed graphite (glass graphite can also be preferably used) was positioned in the center of the vacuum chamber in the middle of the rotating substrates to be coated and was connected to a pulse source of low-voltage arc. The magnetic field intensity in the place of motion of the cathode spot was 17 mT. The chamber was evacuated to the pressure of 5×10⁻³ Pa.

Before the entire deposition of the DLC layer the samples were subjected to cleaning with glow discharge for 15 minutes.

During the deposition of the DLC layer, the surface of the substrate was bombarded by carbon ions generated by the pulsed arc of the graphite cathode at the following parameters:

| | |
|---|---|
| Holding current | 80 A |
| Bias at the samples | 600 V |
| Pulse current | 500 A |
| Pulsed arc frequency | 500 Hz |
| Duty cycle | 1% |
| Step length | 15 min |

After the end of the step of bombarding with carbon ions a ta-C layer was applied at the following coating parameters:

| | |
|---|---|
| Holding current | 80 A |
| Bias at the samples | 50 V |
| Pulse current | 600 A |
| Pulsed arc frequency | 1500 Hz |
| Duty cycle | 20% |
| Step length | 35 min |

The micro-hardness of the ta-C layer applied in the last step was 50 GPa, thickness 1 µm, cathode spot speed 0.5 m/s in the step of bombarding with carbon ions and 1.5 m/s in the step of ta-C layer deposition Example 4

A polished sample made of tool steel having the dimensions of 15×15×5 mm was placed in a holder rotating around 3 axes on a substrate holder in a vacuum coating chamber. A central cylindrical rotary graphite cathode made of isostatically compressed graphite (glass graphite can also be preferably used) was positioned in the center of the vacuum chamber in the middle of the rotating substrates to be coated and was connected to a pulse source of low-voltage arc. The magnetic field intensity in the place of motion of the cathode spot was 40 mT. In the door of the vacuum chamber, a titanium cylindrical rotary cathode was placed that was connected to a low-voltage arc source. The chamber was evacuated to the pressure of 5×10⁻³ Pa.

Before the entire deposition of the DLC layer, the substrate was subjected to metal ion etching with Ti ions from the cathode for 10 min and after the end of the metal ion etching a Ti layer was applied for 5 min.

During the deposition of the DLC layer, the surface of the substrate was bombarded by carbon ions generated by the pulsed arc of the graphite cathode at the following parameters:

| Holding current | 40 A |
| Bias at the samples | 400 V |
| Pulse current | 250 A |
| Pulsed arc frequency | 100 Hz |
| Duty cycle | 90% |
| Step length | 10 min |

After the end of the step of bombarding with carbon ions a ta-C layer was applied at the following coating parameters:

| Holding current | 90 A |
| Bias at the samples | floating potential (5-10 V) |
| Pulse current | 1000 A |
| Pulsed arc frequency | 5000 Hz |
| Duty cycle | 10% |
| Step length | 20 min |

The micro-hardness of the ta-C layer applied in the last step was 40 GPa, thickness 1 μm, cathode spot speed 2 m/s in the step of bombarding with carbon ions and 2.5 m/s in the step of ta-C layer deposition Example 5

A polished sample made of tool steel having the dimensions of 15×15×5 mm was placed in a holder rotating around 3 axes on a substrate holder in a vacuum coating chamber. A central cylindrical rotary graphite cathode made of isostatically compressed graphite (glass graphite can also be preferably used) was positioned in the center of the vacuum chamber in the middle of the rotating substrates to be coated and was connected to a pulse source of low-voltage arc. The magnetic field intensity in the place of motion of the cathode spot was 5 mT. In the door of the vacuum chamber, a titanium cylindrical rotary cathode was placed that was connected to a low-voltage arc source. The chamber was evacuated to the pressure of 5×10⁻³ Pa.

Before the entire deposition of the DLC layer, the substrate was subjected to metal ion etching with Ti ions from the cathode for 10 min and after the end of the metal ion etching a Ti layer was applied for 5 min.

During the deposition of the DLC layer, the surface of the substrate was bombarded by carbon ions generated by the pulsed arc of the graphite cathode at the following parameters:

| Holding current | 200 A |
| Bias at the samples | 600 V |
| Pulse current | 400 A |
| Pulsed arc frequency | 500 Hz |
| Duty cycle | 30% |
| Step length | 8 min |

After the end of the step of bombarding with carbon ions a ta-C layer was applied at the following coating parameters:

| Holding current | 80 A |
| Bias at the samples | 50 V |
| Pulse current | 600 A |
| Pulsed arc frequency | 1500 Hz |
| Duty cycle | 20% |
| Step length | 20 min |

The micro-hardness of the ta-C layer applied in the last step was 40 GPa, thickness 1 μm, cathode spot speed 0.2 m/s in the step of bombarding with carbon ions and 0.5 m/s in the step of ta-C layer deposition The layer produced with the use of the method in accordance with the invention is to suitable for use as a wear resistant layer for cutting, shearing and forming tools, as a functional layer on parts where a long service life and a low friction coefficient are required as bearings, piston rings of a combustion engine, gears etc.

The invention claimed is:

1. A method of deposition of a wear resistant DLC layer onto substrates in a vacuum chamber from a rotary cylindrical graphite cathode using a low-voltage arc, comprising:
   alternating current pulses with a holding current to generate the low-voltage pulsed arc;
   moving a cathode spot on a surface of the graphite cathode, while
   steering the motion of the cathode spot on the surface of the graphite cathode by a magnetic field generated by a magnetic field source arranged under the surface of the graphite cathode, wherein
   the value of the current pulses is between 250 and 1000 A, the value of the holding current is between 40 and 200 A, the frequency of the pulses is 100 to 5000 Hz, the pulse duty cycle is 1 to 90% and the intensity of the magnetic field in the place of the cathode spot is 5 to 40 mT.

2. The method according to claim 1, wherein the motion of the cathode spot on the surface of the graphite cathode is steered by the magnetic field along a path having a closed loop.

* * * * *